United States Patent
Ramesh

[11] Patent Number: 5,838,035
[45] Date of Patent: *Nov. 17, 1998

[54] BARRIER LAYER FOR FERROELECTRIC CAPACITOR INTEGRATED ON SILICON

[75] Inventor: Ramamoorthy Ramesh, Burtonsville, Md.

[73] Assignee: Bell Communications Research, Inc., Morristown, N.J.

[ * ] Notice: The term of this patent shall not extend beyond the expiration date of Pat. No. 5,777,356.

[21] Appl. No.: 896,508

[22] Filed: Jun. 10, 1997

Related U.S. Application Data

[63] Continuation of Ser. No. 497,457, Jun. 28, 1995, abandoned.

[51] Int. Cl.$^6$ .................................................. H01G 4/06
[52] U.S. Cl. ............................................ 257/295; 257/751
[58] Field of Search ................................ 438/3, 240, 627; 257/295, 751

[56] References Cited

U.S. PATENT DOCUMENTS

| | | | |
|---|---|---|---|
| 4,423,087 | 12/1983 | Howard et al. | 427/79 |
| 4,495,222 | 1/1985 | Anderson et al. | 437/190 |
| 5,122,477 | 6/1992 | Wolters et al. | 437/60 |
| 5,130,275 | 7/1992 | Dion | 437/190 |
| 5,146,299 | 9/1992 | Lampe | 357/51 |
| 5,155,658 | 10/1992 | Inam et al. | 361/321 |
| 5,168,420 | 12/1992 | Ramesh et al. | 361/321 |
| 5,248,564 | 9/1993 | Ramesh | 361/321 |
| 5,270,298 | 12/1993 | Ramesh | 361/321 |
| 5,449,933 | 9/1995 | Shindo et al. | 257/295 |
| 5,468,684 | 11/1995 | Yoshimori et al. | 437/190 |
| 5,471,084 | 11/1995 | Suzuki et al. | 257/751 |
| 5,471,363 | 11/1995 | Mihara | 361/305 |
| 5,479,317 | 12/1995 | Ramesh | 361/321.5 |
| 5,519,235 | 5/1996 | Ramesh | 257/295 |
| 5,554,866 | 9/1996 | Nishioka et al. | 257/295 |
| 5,555,486 | 9/1996 | Kingon et al. | 437/60 |
| 5,561,307 | 10/1996 | Mihara et al. | 257/295 |
| 5,563,762 | 10/1996 | Leung et al. | 257/295 |
| 5,593,914 | 1/1997 | Evans, Jr. et al. | 438/240 |
| 5,604,145 | 2/1997 | Hashizume et al. | 438/240 |
| 5,665,628 | 9/1997 | Summerfelt | 438/240 |

FOREIGN PATENT DOCUMENTS

| | | | |
|---|---|---|---|
| 0494313 | 7/1992 | European Pat. Off. | 257/295 |
| 4092468 | 3/1992 | Japan | 257/295 |
| 5145077 | 6/1993 | Japan | 257/295 |
| 92002050 | 2/1992 | WIPO | 257/295 |
| 92 07382 | 4/1992 | WIPO | 257/295 |

*Primary Examiner*—Charles L. Bowers, Jr.
*Assistant Examiner*—Matthew Whipple
*Attorney, Agent, or Firm*—Joseph Giordano; David A. Hey; Loria B. Yeadon

[57] ABSTRACT

A ferroelectric cell in which a ferroelectric stack of a perovskite ferroelectric sandwiched by cubic perovskite metal-oxide conductive electrodes are formed over a silicon body, such as a polysilicon plug penetrating a field oxide over a silicon transistor. According to the invention, an oxidation barrier is placed between the lower metal-oxide electrode and the polysilicon. The oxidation barrier may be: (1) a refractory metal sandwiched between two platinum layer which forms a refractory oxide in a platinum matrix; (2) an intermetallic barrier beneath a platinum electrode, e.g., of NiAl; or (3) a combination of Ru and $SrRuO_3$ or similar materials. Thereby, the polysilicon plug is protected from oxidation.

17 Claims, 6 Drawing Sheets

BARRIER LAYER FOR FERROELECTRIC CAPACITOR INTEGRATED ON SILICON

This application is a continuation of application Ser. No. 08/497,457 filed on Jun. 28, 1995 now abandoned.

FIELD OF THE INVENTION

The invention generally relates to ferroelectric and other high-dielectric perovskite-based memories. In particular, the invention relates to a material structure allowing ferroelectric material to be formed as crystalline material over a silicon substrate.

BACKGROUND OF THE INVENTION

Most of the memory devices that are now commercially available are based on silicon technology, which has enjoyed enormous commercial and technical success because of its increasing device density and decreasing cost. One of the most popular memory devices is a dynamic random-access memory (dRAM) which, in essence, is a capacitor usually composed of polysilicon electrodes sandwiching a silicon dioxide gap., The leakage current across the gap is small enough to allow charge to be stored on the cell for a few milliseconds without active powering, after which the cell is refreshed by reading its present value and, if a charged state is detected, restoring the original quantum of charge. For applications in which periodic refreshing is operationally a problem, a static RAM (sRAM) is available, which in essence is a flip-flop that can be switched between two stable powered states, but, if the power is removed, the memory state is lost. That is, both dRAMs and sRAMs are volatile. However, some applications require at least some memory be non-volatile so that the stored data is retained even if no power is applied to the memory cell over long periods. Read-only memory (ROM) has this capability but, in general, cannot be rewritten with new data. Various types of electrically alterable ROM (EAROM) have been developed, typically relying on charge injection into an insulating layer, but their writing speed is usually very slow and requires high voltages.

As a result, significant development has occurred over the past few years in ferroelectric memories which, of themselves, do not use a silicon-based material for the memory material but instead use as the storage medium a ferroelectric material, such as lead zirconium titanate (PZT). The following discussion will use PZT as the prototypical ferroelectric, but the invention is equally applicable to many other ferroelectric materials.

The ferroelectric material is sandwiched between two electrodes to form a capacitor. A ferroelectric is characterized by being switchable between two states of electrical polarization. Either of the two states is stable after power is removed, and the polarization state can be measured by measuring the polarity of charge the ferroelectric induces on the capacitor plates. Therefore, ferroelectric memories are non-volatile and can be integrated to high densities similarly to silicon dRAMs. Often ferroelectric memory cells are directly integrated into gate electrodes for silicon electrodes, as disclosed by Lampe et al. In U.S. Pat. No. 5,146,299.

However, commercially available ferroelectric memories have not been as densely integrated into large arrays as desired. It is believed that many of the problems originate from the polycrystalline nature of ferroelectric material grown over a metallic electrode. The high quality of polycrystalline material is difficult to maintain for very small cells. Furthermore, the polycrystalline grain boundaries present failure modes for the thin ferroelectric material desired for dense integration, that is, a large number of memory cells on one chip. Inam and I recognized in U.S. Pat. No. 5,155,658 that yttrium barium copper oxide (YBCO) could be epitaxially formed over a crystalline substrate and crystalline ferroelectric lead zirconate titanate (PZT) epitaxially formed thereover and the YBCO would act as a bottom electrode for the resultant ferroelectric memory cell. This structure was modeled after previous work disclosed by myself and Tarascon in U.S. Pat. No. 5,168,240.

Although the above perovskite materials, e.g. YBCO and PZT, have been shown to grow as single crystals on a crystalline perovskite substrate, it is much preferable if a silicon substrate can be used. Silicon wafers are widely available and inexpensive, and an integrated memory array requires support circuitry best implemented in silicon. Hence, the need exists to grow crystalline ferroelectrics on a silicon substrate. In the past this development has concentrated on the optimum selection of a buffer layer to chemically isolate the underlying silicon from the ferroelectric and template layer thereover to initiate the crystallization and formation of the correct phase in the desired crystallographic orientation.

In U.S. Pat. No. 5,270,298 disclosed a structure in which the (100)-oriented silicon substrate is overlaid with yttria stabilized zirconia (YSZ) followed by a templating layer of an anisotropic perovskite, such as YBCO or bismuth titanate ($Bi_4Ti_3O_{12}$, hereinafter BTO). Thereover is grown the multi-layer crystalline perovskite device structure. As an example, the ferroelectric capacitor is a YBCO/PZT/YBCO structure which relies upon the metallic properties at room temperature of the prototypical perovskite superconductor YBCO. The YSZ layer acts not only as a buffer layer but also as a barrier to prevent the diffusion of chemical species from the layer above into the silicon substrate, which could further migrate to degrade semiconductor devices formed on the silicon substrate. The bottom YBCO electrode, which grows in a c-axis orientation and with very high crystalline quality, serves both as an electrical contact and as a structural template for the subsequent growth of the cubic PZT layer.

However, YBCO suffers from the disadvantage that, to be grown with a c-axis orientation, the substrate heater temperature needs to be close to 800° C. although the substrate surface temperature is about 50° C. lower. Such temperatures are not completely compatible with the Si-CMOS processing desired for the support circuitry of the integrated ferroelectric memory circuit. Furthermore, the use of layered, anisotropic perovskites, such as YBCO, for electrodes or other elements causes problems that are best avoided.

The problems with YBCO electrodes can be avoided by the use of electrodes of cubic metal oxides, which are isotropic and which grow with high crystalline quality at much lower temperatures. One such oxide is $LaSrCoO_3$ (LSCO, actually approximately $La_{1-x}Sr_xCoO_3$, where x is between 0.15 and 0.85, preferably about 0.5), which grows with almost singly crystalline quality in the temperature range of 550°–650° C. Other examples are $LaCrO_3$, $SrRuO_3$, and related metallic perovskites. However, these cubic metallic oxide materials grown directly on a YSZ-buffered silicon substrate with the desired crystallographic orientation, and consequently the subsequently grown ferroelectric PZT have poor crystallographic properties.

However, in U.S. Pat. No. 5,270,298, we describe the highly crystalline growth of LSCO on YSZ-buffered silicon by the use of an intermediate, thin (20 to 40 nm) layered perovskite, especially BTO. When a c-axis oriented crystallographically templating layer is, grown at a suitable temperature (in the case of BTO in the temperature range of 600°–690° C. and optimally at about 640° C.), the templating layer prefers to grow with its c-axis normal to the silicon substrate. The preference in crystallographic growth direction arises from the anisotropic crystal structure of these layered perovskites and the consequent anisotropy of the surface energies of different crystallographic facets. In this case, the lowest-energy surface is the a-b plane, that is, the surface that is normal to the c-axis and has an approximately square surface lattice spacing.

The a-b plane of the layered perovskite templating materials have in-plane lattice dimensions and crystal chemistry that is, metal-oxygen bonding, that are almost identical to those of the cubic perovskites. Consequently, when the cubic perovskite such as LSCO or the anisotropic ferroelectric perovskite PZT is grown on top of the templating layer, it grows in the desired crystallographic phase and orientation, the perovskite phase with typically the (001)-direction being normal to the surface. The cubic perovskite grown in this fashion usually manifests excellent crystalline quality, as evidenced by x-ray diffraction and transmission electron microscopy, and, more importantly, exhibit very desirable ferroelectric properties, probably due to the chemical templating that occurs in crystallographical templating of similar metal-oxide materials. This templating approach is quite general and hence can be used to grow a variety of cubic perovskite oxides or other more complex perovskites on top of typically YSZ-buffered silicon wafers, thus marrying two very dissimilar types of materials and leading to a vast range of potential applications.

Rather than following Lampe et al. and connecting the ferroelectric memory cell to the gate of a transistor, a preferred approach in making an integrated ferroelectric memory element involves selectively delineating a ferroelectric capacitor that is electrically connected to the drain or source of the silicon pass-gate transistor. Accordingly, the interface between the silicon and the ferroelectric stack must remain conductive.

In operation, an electrical signal applied to the gate of the pass-gate transistor determines whether the ferroelectric capacitor is connected to the word line for reading or writing or is isolated from it. Pass-gate transistors typically are configured as CMOS transistors with $SiO_2$ as the gate dielectric. Therefore, it is preferable that the ferroelectric deposition be carried out under conditions compatible with prior silicon CMOS processing. Even better, the ferroelectric memory cell should be grown in or on an $SiO_2$ layer already formed on the silicon wafer for part of the CMOS fabrication process. However, experience has generally shown that direct growth of the cubic perovskite, for example LSCO on $SiO_2$-coated silicon, produces a capacitor structure with poor ferroelectric properties.

I have however shown in U.S. Pat. No. 5,248,564 that a templating layer of BTO grown on $SiO_2$ under the correct growth conditions allows a layer of highly oriented LSCO to be grown thereover. The LSCO acts both as an electrode and a crystallographically templating substrate layer for an upper ferroelectric layer of PZT templated to a c-axis orientation. Its thickness should be sufficient that the overlayers do not contact the $SiO_2$/Si substrate. The BTO layer is a thin templating layer of a layered perovskite which has a,b lattice parameters that are closely matched to those of the overgrown cubic perovskite LSCO.

There results a c-axis oriented LSCO/PZT/LSCO ferroelectric capacitor grown on an $SiO_2$-buffered silicon wafer. Although these capacitive structures show quite desirable ferroelectric properties, the electrical conductivity of the LSCO electrodes is lower than desirable for an integrated circuit memory array and lower than that obtainable from a more conductive material, such as metallic platinum, which would need to be placed at the bottom of the later grown crystalline ferroelectric memory stack.

I have described in U.S. patent application Ser. No. 08/318,587, filed Oct. 5, 1994, now U.S. Pat. No. 5,479,317 that a very highly oriented thin film of platinum can be grown on the surface of a substrate such as $SiO_2$-covered Si, even though the surface is amorphous. For example, as shown in cross section in FIG. 1, an $SiO_2$ layer 10 is grown over a Si substrate 12, which is understood to possibly include different layers defined vertically by doping and perhaps also laterally defined for a silicon transistor. A template layer 14 of BTO grown to a thickness of 30 to 50 nm at a temperature range of 640° to 680° C. forms with a c-axis orientation. Then, when a platinum thin film 16 is grown on this surface at a growth temperature of 580° to 640° C., it is grown with a very strong (001)-orientation. The oriented platinum film 16 allows after-grown layers, such as a ferroelectric stack including two cubic, metal-oxide layers 18 and 20 of LSCO sandwiching a ferroelectric PZT layer 22, to be epitaxially deposited with a strongly crystalline or at least highly oriented structure. Thereby, a crytalline ferroelectric memory can be formed. The ferroelectric material is quite general. It may be PZT or other cationically substituted derivatives such as lead lanthanum zirconium titanate (PLZT) or lead niobium zirconium titanate (PNZT) or similar materials in which substitutions of donor dopants such as La, Nb, or others occur at the Pb site. In PZT, the ratio of zirconium and titanium can be greatly varied. I have disclosed yet other ferroelectric materials in U.S. patent application Ser. No. 08/341,728, filed Nov. 11, 1994, now U.S. Pat. No. 5,519,235.

Although the crystallographically templating approach provides highly oriented ferroelectric capacitor stacks with excellent ferroelectric reliability characteristics, the bismuth titanate template layer requires an additional deposition step and an additional etching step in the formation of the memory element. It would be preferable to grow the ferroelectric material on a silicon wafer without the intervening layered-perovskite template layer. Furthermore, a metallic layer beneath the ferroelectric layer would be more preferable even though past experience has shown that PZT grown on platinum leads to poor ferroelectric properties, notably poor fatigue characteristics. Finally, CMOS pass-gate transistors require a silicon oxide layer over the silicon wafer. It would be preferable to grow the ferroelectric stack on a $SiO_2$/Si wafer with an intervening Pt layer to reduce sheet resistance, but without the necessity of a template layer. The structure in the aforementioned patent application '235, as illustrated in cross section in FIG. 2, is similar to that of FIG. 1, but there is no BTO crystallographically templating layer but a titanium layer 24 underlies the Pt layer 16 on top of the $SiO_2$ layer 10. While this structure works for ferroelectric stacks over an silicon dioxide layer, a similar stack formed over silicon requires that the silicon-to-metal oxide interface not be further oxidized.

The above described growth processes, while useful for memory integration on the order of 1 MB, suffer disadvantages for higher density architectures in which it is much preferable that the capacitor structure be directly integrated with the silicon circuits and be in direct electrical contact with the Si-based CMOS part of the wafer. The contact to the silicon wafer is typically made through a polysilicon plug that is deposited on the silicon wafer without any interfacial SiO$_2$ layer. It is imperative that during deposition of the ferroelectric no oxygen diffuse downwardly to the polysilicon and oxidize it into insulating SiO$_2$. However, contacting the polysilicon plug to the ferroelectric capacitor stack is quite difficult since the ferroelectric stack, such as LSCO/PZT/LSCO, is grown under highly oxidizing ambients at elevated temperatures in the range of 550°–700° C. Oxygen is thus readily available and at high temperatures so that it easily diffuses to the polysilicon plug with which it forms a surface layer of SiO$_2$, thereby breaking the electrical contact between the polysilicon and the ferroelectric stack. Platinum is a preferred metallic contact layer for ferroelectrics. Although oxygen does not significant react with Pt, it readily diffuses through the Pt to react with underlying layers.

As a result, a barrier layer needs to be inserted between the polysilicon plug and the bottom electrode of the ferroelectric stack. Barrier layers such as TiN are well known but are not viable in this situation because they too are oxidized under the processing conditions used to fabricate the ferroelectric stack.

SUMMARY OF THE INVENTION

The invention can be summarized as a ferroelectric capacitive cell in which a conductive perovskite layer, especially a cubic perovskite layer, is formed over the metal electrode and serves as a chemical template for the perovskite ferroelectric layer. A composite diffusion barrier is used to isolate the underlying silicon, usually a polysilicon plug, from the harshly oxidizing environment prevalent during deposition of the perovskite ferroelectric stack, for example, of LSCO/PZT/LSCO. In a first embodiment, the diffusion barrier may be a refractory metal layer beneath a platinum layer. The oxygen diffuses through the platinum but reacts with the refractory metal to form balls of refractory oxide within a platinum matrix. In a second embodiment, an intermetallic layer prevents oxygen diffusion to the silicon. In a third embodiment, Ru and SrRuO$_3$ and similar material combinations acts as an electrode and oxidation barrier.

DETAILED DESCRIPTION OF THE PREFERRED EMBODIMENTS

Figure 1:
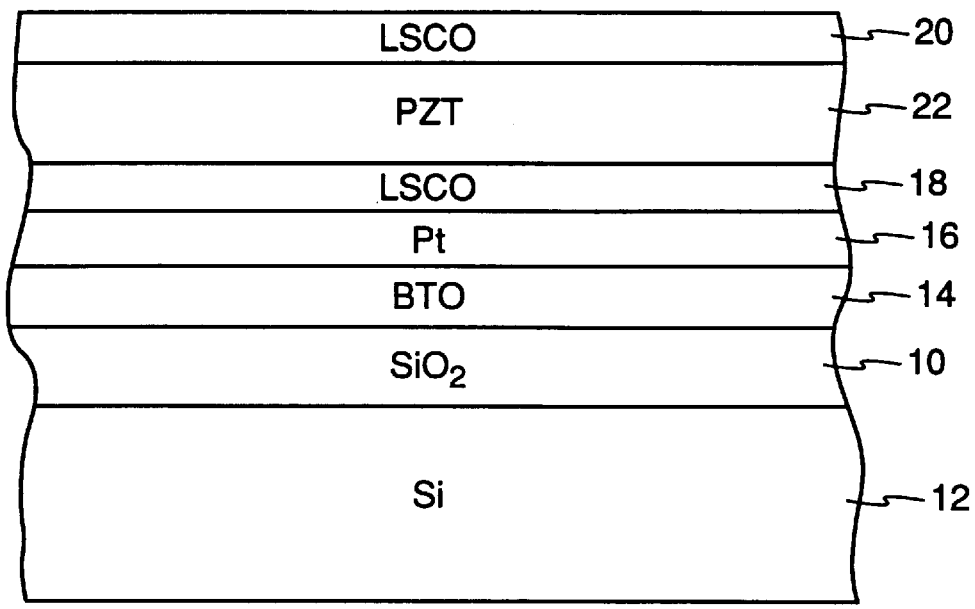
FIGS. 1 and 2 are cross-sectional views of a ferroelectric structure related to the invention and utilizing perovskite templating layers above a metal layer.
Figure 2:
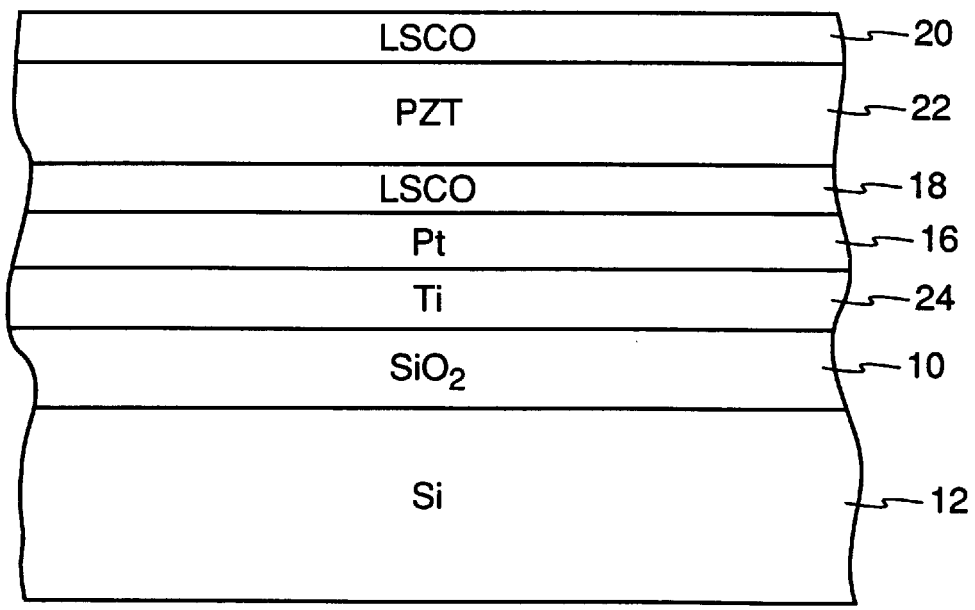
Figure 3:
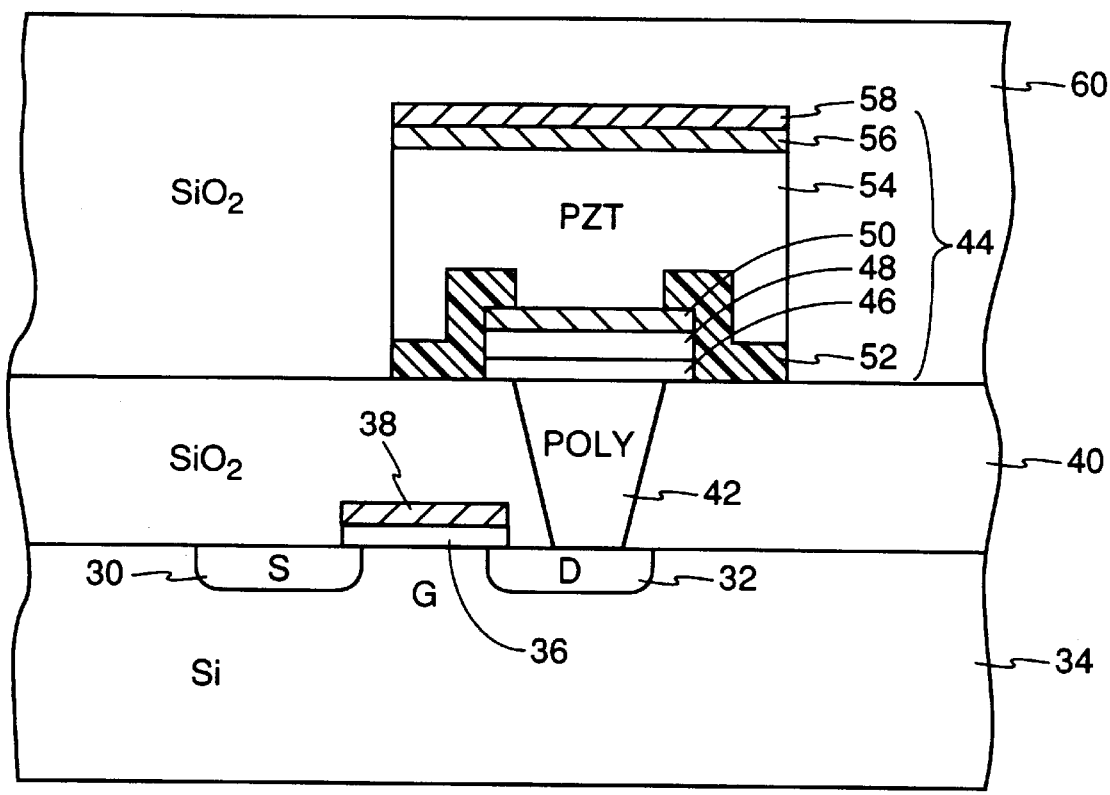
FIG. 3 is a cross-sectional view of a ferroelectric cell utilizing the barrier layer of the invention.

A general embodiment of the invention is illustrated in cross section in FIG. 3. A source 30 and a drain 32 are formed in a silicon wafer 34. A gate insulator layer 36 of SiO$_2$ and a metal contact and interconnect layer 38 are formed over the gate region. A field oxide 40 is deposited thereover. An area for a polysilicon plug 42 is etched through the field oxide 40 overlying the drain 32 and the plug 42 is deposited therein, and thereover is formed a ferroelectric stack 44. The structure of FIG. 3 does not illustrate the contact to the source 30 and the gate, which may have their own polysilicon plug with a metal contact thereover.

The dielectric stack 44, in this general embodiment, includes an electrically conductive barrier layer 46, a metallic layer 48, and a bottom conductive metal oxide electrode 50. The stack 44 is patterned and etched, and thereover is formed an inter-dielectric layer 52 of SiO$_2$ or TiO$_2$ conformally deposited over the lower part of the stack 44. Thereover is deposited a ferroelectric layer 54, a top electrode 56, and a top metallization 58. These features are patterned and etched, and thereover is deposited another SiO$_2$ layer 60. The contact to the metallization is not explicitly shown. This illustration does not show contacts to the gate and drain, which may be similar or otherwise formed.

The barrier layer 46 of the invention prevents oxygen from the oxygen-rich templating layer 48 and other overlying layers, typically formed of an oxide metal, from diffusing therethrough and oxidizing the top surface region of the polysilicon plug 42 into insulating silicon dioxide. Especially, the oxidizing atmospheres used to grow perovskite overlayers, preferably in the elevated temperature range of 500°–650° C., strongly oxidize unprotected underlayers by the high-temperature diffusion of oxygen through typical overlayers.

Figure 4:
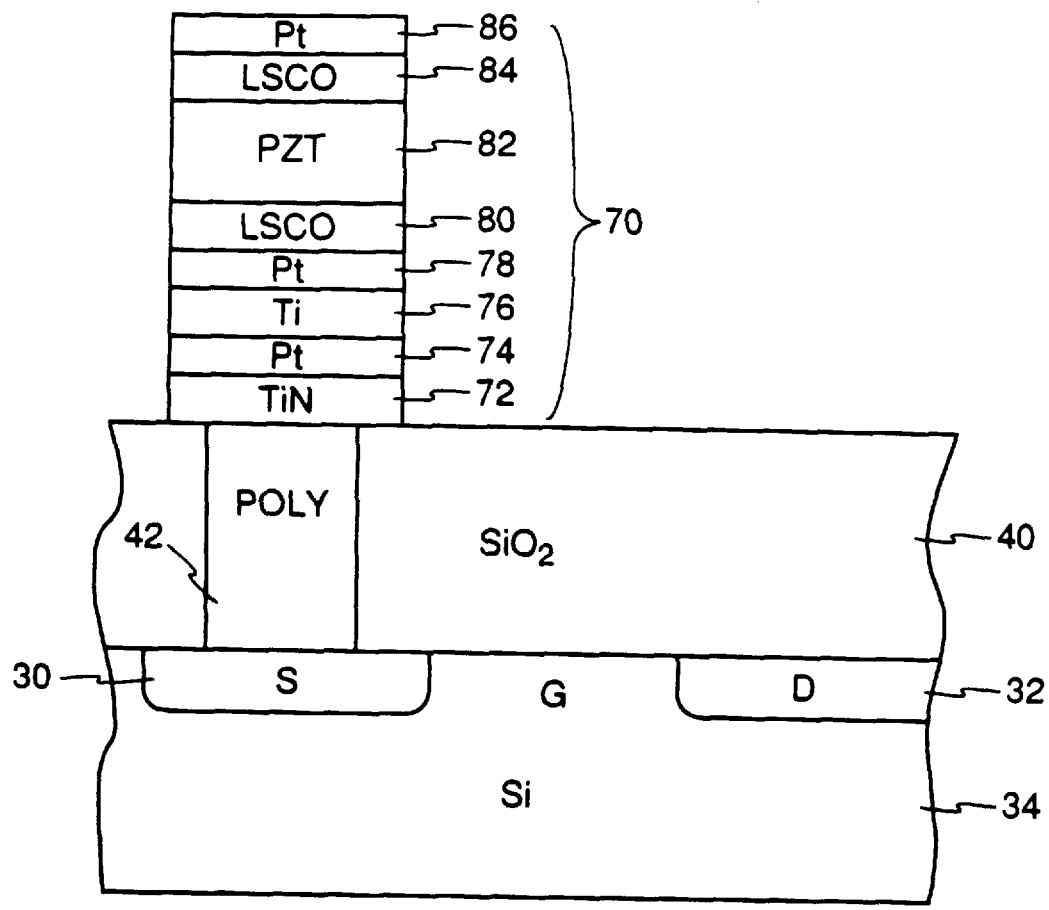
FIG. 4 is a cross-sectional view of a first embodiment of the invention utilizing a cubic perovskite layer above a metal layer, wherein the illustrated structure does not account for oxidation produced in formation of the upper layers.

In a first specific embodiment of the invention, illustrated in cross section in FIG. 4, a ferroelectric stack 70 includes a conventional base barrier layer 72 of TiN deposited over the polysilicon plug 42, and over the TiN barrier layer 72 is deposited an oxygen-diffusion barrier comprising a lower conductive metal layer 74, a refractory metal layer 76, and an upper metal layer 78. Preferably, the conductive metal layers 74 and 78 are composed of a conductive metal such as a noble metal, preferably platinum, and the refractory metal layer 76 is composed of Ti, Mo, W, or Ta. Thereover are formed a lower, conductive cubic perovskite layer 80, e.g. of LSCO, a PZT ferroelectric layer 82, and an upper, conductive cubic perovskite layer 84. The lower, cubic perovskite layer 80 acts as a chemical template for the formation of a c-axis oriented layered perovskite ferroelectric layer 82. The LSCO provides a metal that is octahedrally bonded with oxygen, which is chemically compatible with the over-grown oxide PZT. The upper electrode layer 84, e.g. of LSCO is grown over the PZT layer 82 and an upper Pt layer 86 contacts the upper LSCO layer 84 and provides a metallization. The drain 32 is contacted by separate means, such as a polysilicon plug parallel to the source plug 42 with an overlying metal layer.

Figure 5:
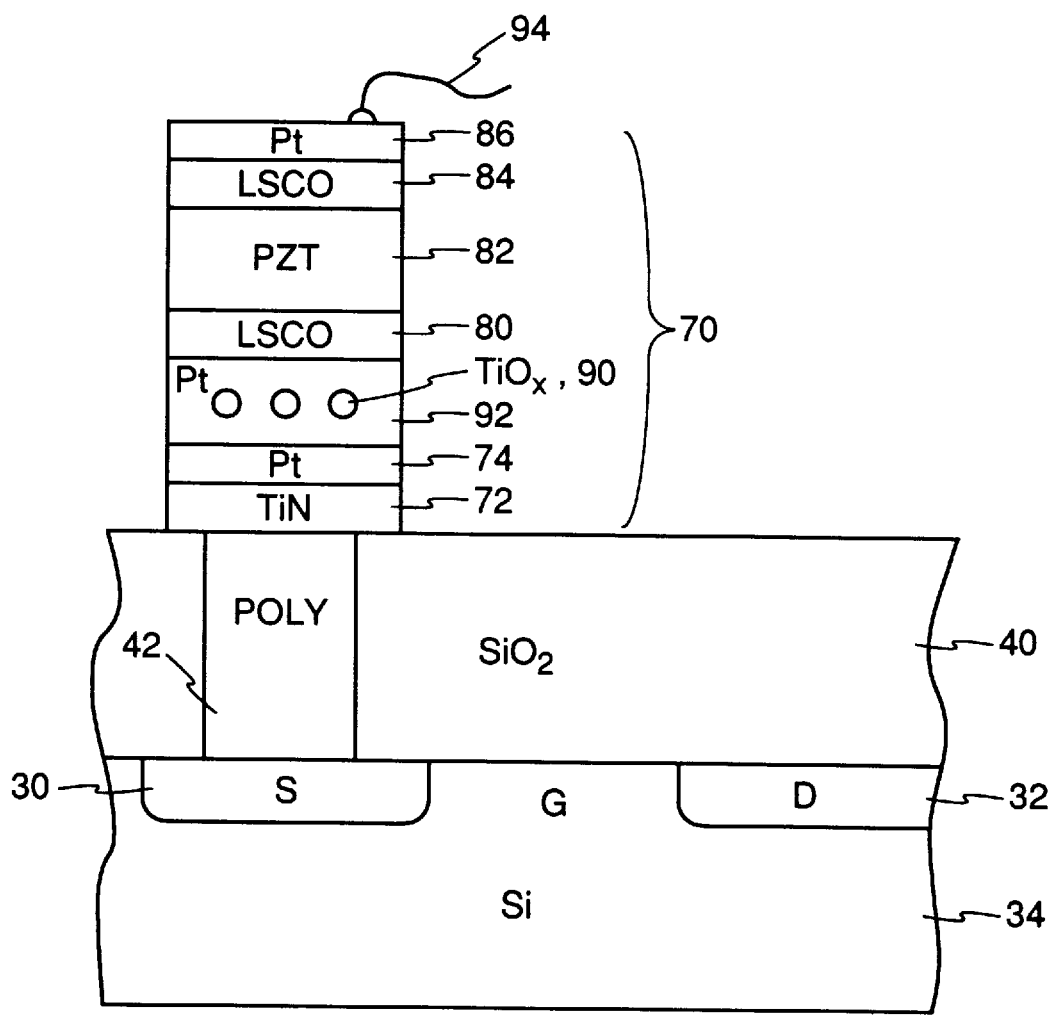
FIG. 5 is a cross-sectional view of the embodiment of FIG. 4 showing the effect of oxidation on the metal layers.

The refractory metals used in this invention are known getterers of oxygen. When exposed to oxidizing ambients at elevated temperatures in the range of 550°–650° C., such as are preferred for the growth of the LSCO and PZT layers 80, 82, and 84, oxygen diffuses through the noble metal layer 78 and oxidizes the refractory metal layer 76. As illustrated in cross section in FIG. 5, the metal oxide balls up and forms islands 90 in a platinum matrix layer 92. Thereafter, an electrical lead 94 is connected to the upper electrode layer 86, and the oxygen being bound up in the islands 90 will not prevent electrical contact through the Pt matrix 92. Depending upon the type of metal that is used in the refractory layer 76, these metal oxide islands 90 can be either conducting, semiconducting, or insulating. Examples of other refractory metals usable in layer 76 are Ta and Mo.

This embodiment is related to what I have described in the aforementioned U.S. patent application Ser. No. '235, namely an $SiO_2$-buffered silicon substrate overlaid with a hybrid stack of Ti followed by Pt, over which is deposited the LSCO/PZT/LSCO ferroelectric cell. However, the two differ significantly. In the '235 patent, an $SiO_2$ layer lies between the silicon substrate and the Ti/Pt hybrid layer. The $SiO_2$ is highly insulating so diffusion of oxygen toward the substrate or oxidation of Ti are not critical problems. Indeed, the geometry of the patent application has both contacts on the front side so that at the bottom only the LSCO electrode layer need conduct and the conductivities of the Pt and Ti layers are not critical. In contrast, in the embodiment of FIG. 5, the TiN layer 72 is conductive and the polysilicon plug 42 must be protected against oxidation lest it turn insulating and prevent contacting from the back side. Thus, the Pt and Ti layers 74, 76, and 78 are arranged with a double Pt structure sandwiching the oxidizable Ti to allow conductance around the balled-up $TiO_x$.

A common theme exists between the two structures, namely, that conventional crystallographic templates are not necessary for high quality ferroelectric cell but chemical templates will suffice. A crystallographically templating layer of BTO provides highly oriented crystallographic growth in the c-direction and also provides chemical consistency between the perovskite BTO and the after grown perovskite PZT or other ferroelectric layer. A templating layer of LSCO may afford some orientational templating, particularly when it is grown over a partially oriented Pt layer. However, the thermodynamics are not as strong as for the layered BTO. Instead, LSCO's principal contribution seems to be a chemically templating effect. The metal oxides such as PZT can grow in many different phases, e.g., perovskite, pyrochlore, and rutile. Only the perovskite phase demonstrates the desired ferroelectric effect. If the underlying layer, however, is formed of another perovskite material, such as LSCO, having the same octahedral bonding of oxygens around the metal atoms, the after-grown layer is much more likely to form a high-quality perovskite layer without large intergranular spaces which promote various failures mechanisms. Although LSCO may well not cause strong orientational templating of the PZT layer, the resultant PZT still has sufficient uniformity to avoid the fatigue problems which plague PZT grown on Pt without further attempts to improve the crystallography.

If the refractory metal layer 36 is replaced by a Group VIII intermetallic layer of Ru, Ir, or Os, the oxide produced by oxidation is conductive and the layer 48 of the intermetallic oxide may be fairly homogeneous after oxidation.

Figure 6:
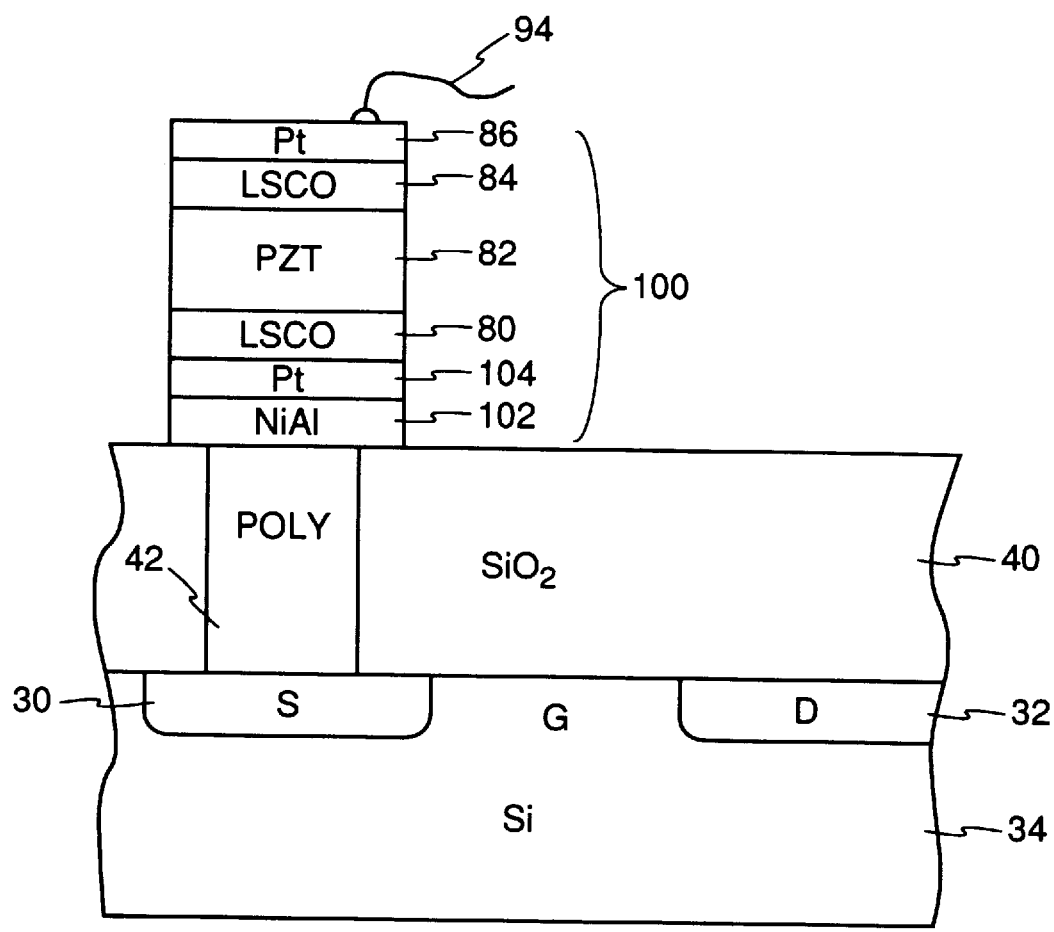
FIG. 6 is a cross-sectional view of a second embodiment of the invention utilizing an intermetallic alloy as the oxygen-diffusion barrier.

In a second embodiment of the invention, illustrated in cross section in FIG. 6, a dielectric stack 100 includes a thin layer 102 of an oxidation-resistant binary intermetallic alloy, such as NiAl, NiTi, NiMn, or NiFe, deposited over the polysilicon plug 42. A platinum lower electrode 104 is grown over the intermetallic alloy layer 102, and the LSCO/PZT/LSCO stack 80, 82, and 84 is grown thereover. The intermetallic alloy 102, when grown at stoichiometric composition, is well known to be a very conductive metal and resistant to oxidation. Importantly, it acts as a barrier layer to the diffusion of oxygen during the high-temperature growth of the perovskites LSCO 80 and 84 and PZT 82. The intermetallic alloy 102 can have the general composition of approximately AB or $A_3B$, where A can be Ni or Co and B can be Al, Ti, Mg, Cr, or Fe.

Figure 7:
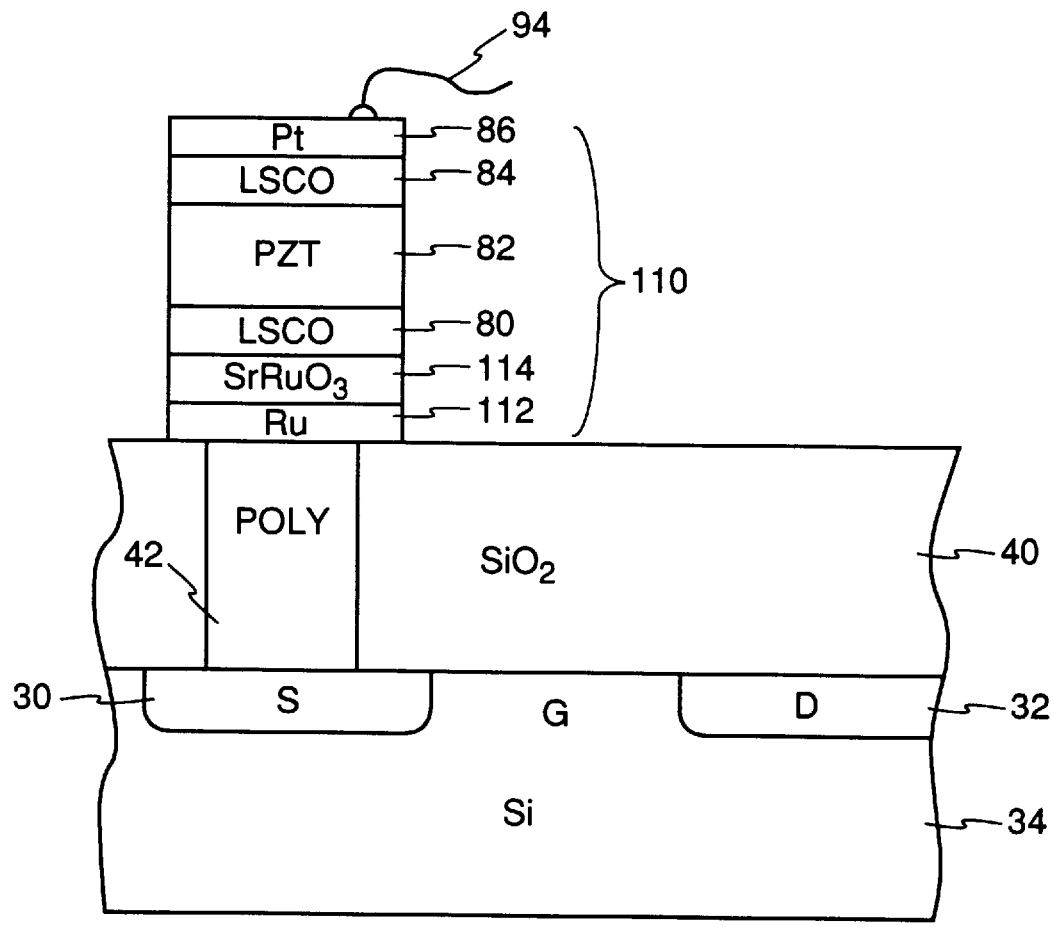
FIG. 7 is a cross-sectional view of third embodiment of the invention utilizing a ruthenium metal layer and a conductive strontium ruthenium oxide layer.

A third embodiment of the invention, illustrated in cross section in FIG. 7 employs a structure known to be effective in the integration of materials with high dielectric constants on a polysilicon plug. A dielectric stack 110 includes at its bottom a thin layer 112 of Ru deposited over the polysilicon plug 42 and which acts as an oxidation barrier. A thin layer 114 of $SrRuO_3$ or more generally $Sr_xRu_{2-x}O_3$, where x is preferably about unity, so as to yield a stoichiometric layer, but may have values $0.9<x<1.1$, is deposited over the Ru layer 112, it also acts as an oxygen-diffusion barrier and importantly forms in a perovskite structure to promote chemical templating for an overgrown perovskite layer 80, of, for example, LSCO. Both layers 112 and 114 may be deposited by evaporation or sputtering. Ruthenium is a conductive metal but its oxide forms a rutile, which does not provide the required templating. Strontium ruthenate on the other hand is a reasonably conducting perovskite oxide. Whatever oxygen diffuses through the $SrRuO_3$ layer 62 will form $RuO_x$ in the Ru layer 112. This oxide $RuO_x$ is very highly conducting. Furthermore, the $SrRuO_3$ layer, being a perovskite structure oxide, helps in the nucleation of the desired perovskite structure in the LSCO/PZT/LSCO ferroelectric stack 110. Alternatively, the metal/metal-oxide heterostructure may be formed of Ir and $Sr_xIr_{2-x}O_3$. The metal layer of Ir and a metal oxide layer of $SrIrO_3$ have similar properties to the corresponding Ru layers. The iridium layer is metallic and conductive, and the perovskite $SrIrO_3$ layer is adequately conductive.

Although the above embodiments have described ferroelectric memories, the invention is equally applicable to memories and other semiconductor structures in which a perovskite layer forms a high-dielectric layer, e.g., in high-performance dRAMs.

The invention thus provides an oxidation barrier layer which allows an oxide-based ferroelectric stack or other perovskite structure to be integrated with a silicon substrate.

What is claimed is:

1. A multi-layer ferroelectric cell comprising:
   a) a substrate providing a silicon surface;
   b) an electrically-conductive barrier formed on said substrate surface for preventing the migration of oxygen to said surface, said barrier comprising a layer of a composition selected from the group consisting of
      1) metallic compositions comprising a metallic matrix having metal oxide islands formed therein,
      2) metallic compositions comprising an electrically-conductive intermetallic alloy comprising a first element selected from the group consisting of Ni, Co, Fe, and Mn and a second element selected from the group consisting of Al, Ga, Ti, and Cr, and
      3) metallic compositions comprising a composite layer comprising a first metal having a conductive perovskite of said first metal formed thereon;
   c) a lower electrode formed on said barrier and comprising an electrically-conductive, chemically-templating perovskite layer;
   d) a ferroelectric layer formed on and templated to said chemically-templating layer; and
   e) an upper electrode formed on said ferroelectric layer.

2. A ferroelectric cell as recited in claim 1, wherein said substrate comprises polysilicon.

3. A ferroelectric cell as recited in claim 1, wherein said lower electrode layer comprises cubic perovskite.

4. A ferroelectric cell as recited in claim 1, wherein said metal oxide comprises a refractory metal.

5. A ferroelectric cell as recited in claim 4, wherein said refractory metal is titanium.

6. A ferroelectric cell as recited in claim 1, wherein said metal oxide comprises a Group VIII metal selected from the group consisting of Ru, Ir, and Os.

7. A ferroelectric cell as recited in claim 1, wherein said metallic matrix comprises a noble metal.

8. A ferroelectric cell as recited in claim 7, wherein said noble metal comprises platinum.

9. A ferroelectric cell as recited in claim 1, wherein said intermetallic alloy comprises NiAl.

10. A ferroelectric cell as recited in claim 1, further comprising a platinum layer formed between said intermetallic alloy layer and said lower electrode perovskite layer.

11. A ferroelectric cell as recited in claim 1, wherein said first metal is selected from the group consisting of ruthenium and iridium.

12. A ferroelectric cell as recited in claim 11, wherein said first metal comprises ruthenium and said conductive perovskite layer thereof comprises ruthenium, strontium, and oxygen.

13. A perovskite electronic heterostructure comprising:
   a) a silicon substrate with a conductive silicon surface;
   b) an electrically-conductive barrier formed on said substrate surface for preventing the migration of oxygen to said surface, said barrier comprising a layer of metallic composition selected from the group consisting of
      1) compositions comprising a composite layer comprising platinum overlaid by a matrix comprising platinum having a metal oxide included therein,
      2) compositions comprising an intermetallic alloy comprising a first element selected from the group consisting of Ni, Co, Fe, and Mn and a second element selected from the group consisting of Al, Ga, Ti, and Cr, and
      3) compositions comprising a composite layer comprising Ru overlaid by a metallic oxide comprising Sr, Ru, and O;
   c) a lower electrode of a conductive cubic perovskite formed on said barrier;
   d) a substantially non-conductive layer of a perovskite formed on said lower electrode; and
   e) an upper electrode of said cubic perovskite formed on said non-conductive layer.

14. A heterostructure as recited in claim 13, wherein said non-conductive layer comprises a ferroelectric perovskite.

15. A heterostructure as recited in claim 13, wherein said matrix metal oxide comprises a refractory metal.

16. A heterostructure as recited in claim 15, wherein said refractory metal comprises Ti.

17. A heterostructure as recited in claim 13, wherein said intermetallic alloy comprises NiAl.

* * * * *